United States Patent
Dickey et al.

(10) Patent No.: US 6,501,170 B1
(45) Date of Patent: Dec. 31, 2002

(54) SUBSTRATES AND ASSEMBLIES INCLUDING PRE-APPLIED ADHESION PROMOTER

(75) Inventors: Brenton L. Dickey, Meridian, ID (US); Tongbi Jiang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/591,144

(22) Filed: Jun. 9, 2000

(51) Int. Cl.[7] .............................................. H01L 23/14
(52) U.S. Cl. ...................... 257/702; 257/701; 257/702; 257/723; 257/778; 252/514
(58) Field of Search ........................ 427/164; 257/666, 257/684, 701, 668, 678; 438/118

(56) References Cited

U.S. PATENT DOCUMENTS

| | | | |
|---|---|---|---|
| 4,489,108 A | * 12/1984 | Postle et al. | 427/164 |
| 5,348,607 A | 9/1994 | Wojnarowski et al. | |
| 5,677,566 A | * 10/1997 | King et al. | 257/666 |
| 5,855,821 A | * 1/1999 | Chau et al. | 252/514 |
| 5,866,949 A | 2/1999 | Schueller | |
| 5,892,277 A | 4/1999 | Ikemizu et al. | |
| 5,914,186 A | 6/1999 | Yau et al. | |
| 5,929,521 A | 7/1999 | Wark et al. | |
| 5,972,739 A | 10/1999 | Funada et al. | |
| 5,977,226 A | 11/1999 | Dent et al. | |
| 5,977,632 A | 11/1999 | Beddingfield | |
| 5,990,545 A | 11/1999 | Schueller et al. | |
| 5,994,772 A | 11/1999 | Shin | |
| 6,013,946 A | * 1/2000 | Lee et al. | 257/684 |
| 6,048,755 A | * 4/2000 | Jiang et al. | 438/118 |
| 6,201,299 B1 | * 3/2001 | Tao et al. | 257/701 |
| 6,252,298 B1 | * 6/2001 | Lee et al. | 257/668 |
| 6,265,766 B1 | * 7/2001 | Moden | 257/678 |
| 6,265,768 B1 | * 7/2001 | Su et al. | 257/684 |

* cited by examiner

Primary Examiner—Hoai Ho
Assistant Examiner—Mai-Huong Tran
(74) Attorney, Agent, or Firm—Traskbritt

(57) ABSTRACT

An apparatus and method for adhesively bonding a back surface of a substrate to an active surface of at least one semiconductor die having adhesive tape interposed therebetween. A wetting agent layer is provided on at least one of the back surface of the substrate and the active surface of at least one semiconductor die. The wetting agent layer interacts with an adhesive on the adhesive tape when the substrate is heated so that the substrate is adhesively bonded to at least one semiconductor die. The interaction of the wetting agent layer allows the adhesive tape to bond thereto at a lower temperature than that of the conventional bonding methods, and more importantly, enhances adhesion thereto.

28 Claims, 3 Drawing Sheets

SUBSTRATES AND ASSEMBLIES INCLUDING PRE-APPLIED ADHESION PROMOTER

BACKGROUND OF THE INVENTION

1. Field of the Invention

The present invention relates to a "chip-over-board" semiconductor assembly, a type of "chip-on-board" (COB) semiconductor assembly. More specifically, the present invention relates to a method and apparatus for attaching a semiconductor device to a substrate for the subsequent wire bonding of the bond pads on the active surface of the semiconductor device to circuits of the substrate.

2. State of the Art

Definitions: The following terms and acronyms will be used throughout the application and are defined as follows:

BGA—Ball Grid Array: An array of minute solder balls disposed on an attachment surface of a semiconductor die wherein the solder balls are refluxed for simultaneous attachment and electrical communication of the semiconductor die to a printed circuit board. A BGA may also be disposed on the printed circuit board. Conductive polymer balls or bumps may also be employed.

COB—Chip-On-Board: The techniques used to attach semiconductor die to a printed circuit board or other suitable substrate. In this instance, COB also refers to a semiconductor die attached to a printed circuit board or substrate having an aperture therein for wire bonds to extend therethrough from the bond pads on the semiconductor die to circuits of the printed circuit board or substrate.

Flip-Chip: A semiconductor chip or semiconductor die having a pattern or array of terminations spaced around the active surface of the chip or die for face-down mounting of the chip or die to a substrate.

Flip-Chip Attachment: A method of attaching a semiconductor die to a substrate in which the die is inverted so that the connecting conductor pads on the face of the device are set on mirror-image pads on the substrate and bonded by solder reflux or a conductive polymer curing.

Wire Bonding: Conductive wires attached between the bond pads on the active surface of a semiconductor die and the circuits of a circuit board or lead frame to form an electrical connection therebetween.

TAB—Tape-Automated-Bonding. Conductive traces are formed on a dielectric film such as a polyimide (the structure also being termed a "flex circuit"). The film is precisely placed to electrically connect a die and a circuit board or lead frame through the traces. Multiple connections are simultaneously effected.

Glob Top: A glob of encapsulant material (usually epoxy or silicone or a combination thereof) surrounding a semiconductor die in a COB assembly.

PGA—Pin Grid Array: An array of small pins extending substantially perpendicular from the major plane of a semiconductor die, wherein the pins conform to a specific arrangement on a printed circuit board or other substrate for attachment thereto.

SLICC—Slightly Larger than Integrated Circuit Carrier: An array of minute solder balls disposed on an attachment surface of a semiconductor die similar to a BGA, but having a smaller solder ball pitch and diameter than a BGA.

State-of-the-art COB technology generally consists of three techniques for attaching semiconductor die to a substrate: flip-chip attachment, wire bonding, and TAB.

Flip-chip attachment consists of attaching a semiconductor die, generally having a BGA, a SLICC or a PGA, to a printed circuit board. With the BGA or the SLICC, the solder ball arrangement on the semiconductor die must be aligned with the connecting bond pads on the printed circuit board such that precise connection is made. After proper alignment, the semiconductor die is bonded to the printed circuit board by reflowing the solder balls. With the PGA, the pin arrangement of the semiconductor die must be a mirror-image of the pin recesses on the printed circuit board. After insertion, the semiconductor die is generally bonded by soldering the pins into place. An underfill encapsulant is then generally disposed between the semiconductor die and the printed circuit board for environmental protection and to enhance the attachment of the die to the board.

Wire bonding, unlike flip-chip attachment, generally begins with attaching either the active surface or the backside of a semiconductor die to the surface of a printed circuit board with an appropriate adhesive, such as an epoxy. In wire bonding, a plurality of bond wires are attached, one at a time, to each bond pad on the semiconductor die and extend to a corresponding lead or trace end of a circuit on the printed circuit board. The bond wires are generally attached through one of three industry-standard wire bonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts. The semiconductor die may be oriented either face up or face down (with its active surface and bond pads either up or down with respect to the circuit board) for wire bonding, although face-up orientation has been more common.

In TAB semiconductor assemblies, ends of metal leads carried on an insulating tape, such as a polyimide, are attached to the bond pads on the semiconductor die and to corresponding lead or trace ends on the printed circuit board. An encapsulant, or plastic resin, is generally used to cover the bond wires and metal tape leads to prevent contamination, aid mechanical attachment of the assembly components, and increase long-term reliability of the electronics with reasonably low-cost materials.

A common manner of forming the encapsulant or plastic package about a semiconductor die assembly is molding and, more specifically, transfer molding. In this process (and with specific reference to COB die assemblies), after the semiconductor die is attached to the substrate (i.e., FR-4 printed circuit board), the semiconductor die assembly is placed in a mold cavity in a transfer molding machine. The semiconductor die assembly is thereafter encapsulated in a thermosetting polymer which, when heated, reacts irreversibly to form a highly cross-linked matrix no longer capable of being re-melted. In addition, another common manner of forming encapsulants for COB assemblages is "glob top" polymeric encapsulation. Glob top encapsulation can be applied by dispensing suitably degassed material from a reservoir through a needle-like nozzle onto the semiconductor die assembly.

The thermosetting polymer of transfer molding generally is comprised of three major components: an epoxy resin, a hardener (including accelerators), and a filler material. Other additives such as flame retardants, mold release agents and colorants are also employed in relatively small amounts. Furthermore, glob top encapsulation can comprise a nonlinear thixotropic material that also includes fillers to achieve the desired degree of thixotropy.

As previously set forth, bonding a semiconductor die to the surface of a substrate for wire bonding chip-on-board and TAB chip-on-board semiconductor assemblies is well known in the art. However, there are problems in the bonding process thereof, and specifically, problems associated with heating the adhesive between the semiconductor die and the substrate. In particular, the substrate is heated to a temperature so that the adhesive flows and then cures to thereby bond the die to the substrate with the cured adhesive therebetween. Some of the problems associated with heating the substrate at the temperature required to flow the adhesive are generally as follows: first, thermal stress exists in the interface between the adhesive and the semiconductor die and the adhesive and the substrate; and second, undesirable outgassing of a solder mask material layering a BGA on the substrate. These problems may result in health and contamination issues, and more importantly, potential detachment of the semiconductor die.

In U.S. Pat. No. 5,972,739, there is illustrated a semiconductor chip attached to a printed circuit board using a sheet of B-stage thermosetting resin having a filler therein, such as particles, fibers, or nonwoven fabric, wherein the active surface, or other surfaces, of the semiconductor chip is treated with a solution of a silane-coupling agent. The bumps on the active surface of the semiconductor chip extend through holes in the B-stage thermosetting resin to contact circuits on the printed circuit board.

In U.S. Pat. No. 5,348,607, a mixture for affixing dice to a substrate is illustrated. The mixture includes a thermoplastic polyimide, a solvent for the polyimide, and a solvent which does not dissolve the polyimide but adds thixotropicity to the mixture. The mixture is applied to the substrate, the dice are placed thereon, and the solvents are evaporated to bond the dice to the substrate. A poor solvent for the polyimide, spread over the dice and exposed portions of die attach material, causes some polyimide to precipitate out of the solution in the exposed portions of the die attach material to form a grid that extends between the dice and prevents the dice from "swimming together" during the high temperature processing. In a solvent die attachment method, the substrate is first coated with a mixture of die attach material and then the mixture is dried. Spraying a solvent over the die attach material causes the material to soften so that the dice applied thereto may adhere. The die attach material is then dried to form the bond.

U.S. Pat. Nos. 5,990,545 and 5,866,949 illustrates a semiconductor die in a chip-scale ball grid array having a nonpolymer layer or support structure positioned between a semiconductor die and a substrate.

U.S. Pat. Nos. 5,977,226 and 5,914,186 illustrate a vacuum dispensable silicone composition having low outgassing properties suitable for use in chip-scale packages and a high temperature antistatic pressure-sensitive adhesive tape.

In U.S. Pat. Nos. 5,994,772, 5,977,632, 5,929,521, and 5,892,277, various types of semiconductor attachments for attaching and electrically connecting a semiconductor die to a substrate are illustrated.

Based on the foregoing, it would be advantageous to develop a method for attaching a semiconductor die to a substrate at lower temperatures than that done conventionally, and thus, prevent the problems as discussed previously.

SUMMARY OF THE INVENTION

The present invention relates to a method and apparatus for bonding an active surface of a semiconductor die to the back surface of a substrate, the substrate having an aperture therethrough for the wire bonds between the bond pads on the active surface of the semiconductor die and the circuits on the front surface to pass through the aperture. Subsequently, the aperture is filled with an encapsulant material, as well as the portions of the wires of the wire bonds being encapsulated. The present invention is directed to a method and apparatus for bonding the active surface of the semiconductor die to the substrate using an adhesive tape therebetween. The method and apparatus includes pretreating the back surface of the substrate and/or the active surface of the semiconductor die with a wetting/adhesion promotion agent layer. The wetting/adhesion promotion agent layer is applied to at least a portion of the back surface of the substrate and/or portions of the active surface of the semiconductor die.

In the present invention, the wetting/adhesion promotion agent layer is directed to increase the surface tension thereof to promote adhesion of the substrate and/or semiconductor die. In addition, by increasing the surface tension, the substrate may be heated at a lower temperature in order for an adhesive on the adhesive tape to flow. In this manner, the present invention provides a decrease in thermal stress in the interface between the semiconductor die and substrate. Further, the lower temperature provides a decrease in the potential for out-gassing from the adhesive used on the tape for attaching the semiconductor die to the substrate during BGA attachment of the substrate and semiconductor die to another substrate. Accordingly, the present invention provides enhanced adhesion between a semiconductor die and a substrate than that provided conventionally.

In addition, the wetting/adhesion promotion agent layer in the present invention may comprise a silane-coupling agent, titanate-coupling agent, and/or a solvent. The wetting/adhesion promotion agent layer may comprise one or more layers and may be applied using a dispensing method, a brushing method, a spraying method, and/or a screen printing method.

In a preferred embodiment, the present invention is directed to bonding a semiconductor die to a substrate for the use of wire bonding chip-on-board semiconductor assemblies.

Alternately, the method and apparatus of the present invention may be directed to pretreating any type of semiconductor device, bare or packaged, and any type of substrate with a wetting agent layer to enhance bonding between multiple substrates, semiconductor devices, and/or a semiconductor die to a substrate, particularly where adhesive tape is used to secure the semiconductor device to a substrate.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
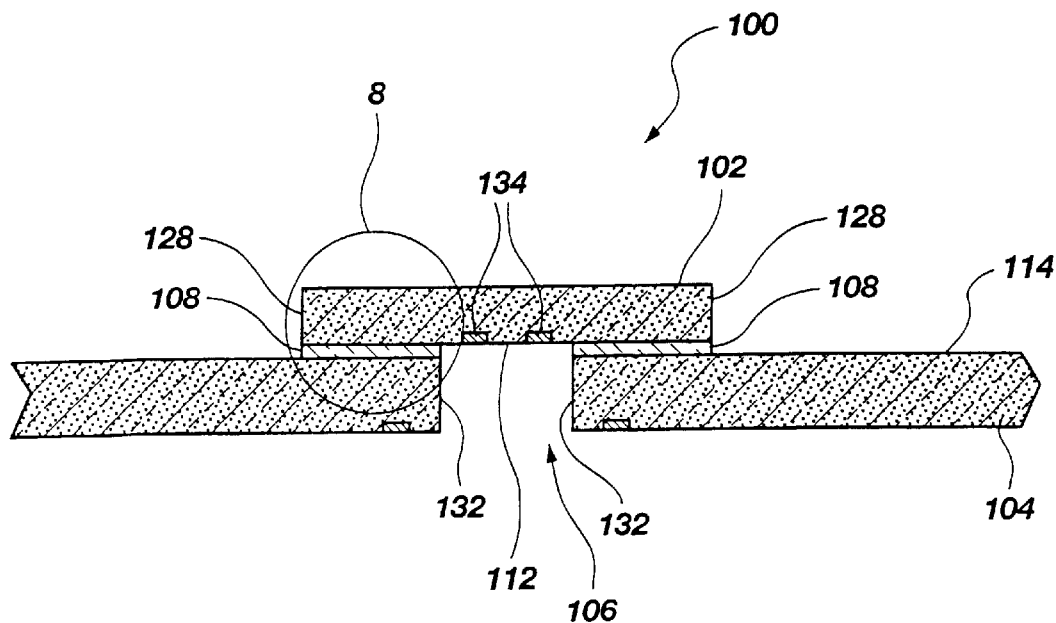
FIG. 1 is a cross-sectional side view of an intermediate semiconductor assembly of the present invention.

Referring to drawing FIG. 1, there is illustrated an intermediate semiconductor die assembly 100 according to the present invention, wherein a semiconductor die 102, such as those known in the art, extends over and is attached to a semiconductor substrate 104 having an opening 106 defined therein. The semiconductor substrate 104 may comprise a BT (Bismaleimide Triazine) substrate, FR-4 printed circuit board, a ceramic substrate or other known substrates including multiple layered substrates. In addition, the present invention is not intended to be limited to the use of one substrate per die assembly.

For purposes of illustration, the semiconductor die 102 may comprise memory devices, such as dynamic random access memory (DRAM) and static random access memory (SRAM), and any other type of semiconductor die.

The adhesive tape 108 is positioned between the semiconductor die 102 and the semiconductor substrate 104 on opposing sides of the semiconductor substrate opening 106, thereby attaching an active surface 112 of the semiconductor die 102 to a back surface 114 of the substrate 104. The adhesive tape 108 includes a carrier film 116, preferably a planar dielectric or insulative carrier film 116 (See FIG. 2), such as UPILEX® (UBE Industries, LTD., Ube City, Japan), KAPTON® (E.I. du Pont de Nemours and Co., Midland, Mich., USA), or other such films. The adhesive tape 108 includes a first adhesive layer 118 on a first planar surface 122 of the carrier film 116 and a second adhesive layer 124 on a second planar surface 126 of the carrier film 116, as shown in drawing FIG. 2.

According to the present invention, the first and second adhesive layers 118 and 124 are preferably an adhesive known as DF-400 made by Hitachi Chemical Co. However, it should be noted that the present invention is not limited to the previously mentioned adhesive and that any suitable adhesive may be used to attach the semiconductor die to the substrate. Further, it should be noted that the first and second adhesive layers 118, 124 may be different types of adhesives or the same type thereof.

In the present invention, prior to interposing the adhesive tape 108 between the semiconductor die 102 and substrate 104, a wetting agent layer 4 is formed on the back surface 114 of the substrate 104 and/or the active surface 112 of the semiconductor die 102. The wetting agent layer 4 can be formed thereon by any suitable method, such as spray methods, brush methods, dispense methods, and/or screen printing methods, although spraying the wetting agent layer 4 is the preferable method in order to provide a substantial uniform layer thereon. The wetting agent layer 4 is most preferably formed as a monolayer thickness, but may be formed as one or more multiple layers or formed in addition to other layers promoting a wetting effect on the surface of either the back surface 114 of the substrate 104, the active surface 112 of the semiconductor die 102, or both. The wetting agent layer 4 may be provided to the active surface 112 of the semiconductor die 102 while in its wafer form prior to or after burn-in testing, or after the wafer has been diced into multiple individual dice or an individual die. As to the substrate 104, the wetting agent layer 4 may be provided thereon at any stage prior to the semiconductor die 102 being attached thereto. In addition, the wetting agent layer 4 may be comprised of any silane-coupling agent, titanate-coupling agent, solvent, and/or any material promoting a wetting effect, so long as there is a sufficient wetting effect on the back surface of the substrate and/or the active surface of the semiconductor die. However, the wetting agent layer 4 utilizing a silane-coupling agent is preferable.

Referring back to drawing FIG. 1, the adhesive tape 108 (shown generally as a width) preferably extends proximate an edge 128 of the semiconductor die 102 and proximate an edge 132 of the substrate opening 106, but may also be positioned to extend past edges 128 and 132 so that the adhesive tape 108 may be narrower or longer in length than that illustrated in drawing FIG. 1. In the preferred configuration, the adhesive tape 108 maximizes the contact area between the semiconductor die 102 and the substrate 104. The increased contact area assists in preventing the semiconductor die 102 from flexing, twisting, or bending away from the substrate 104, thus reducing or eliminating localized stress failures occurring during subsequent molding processes.

Figure 2:
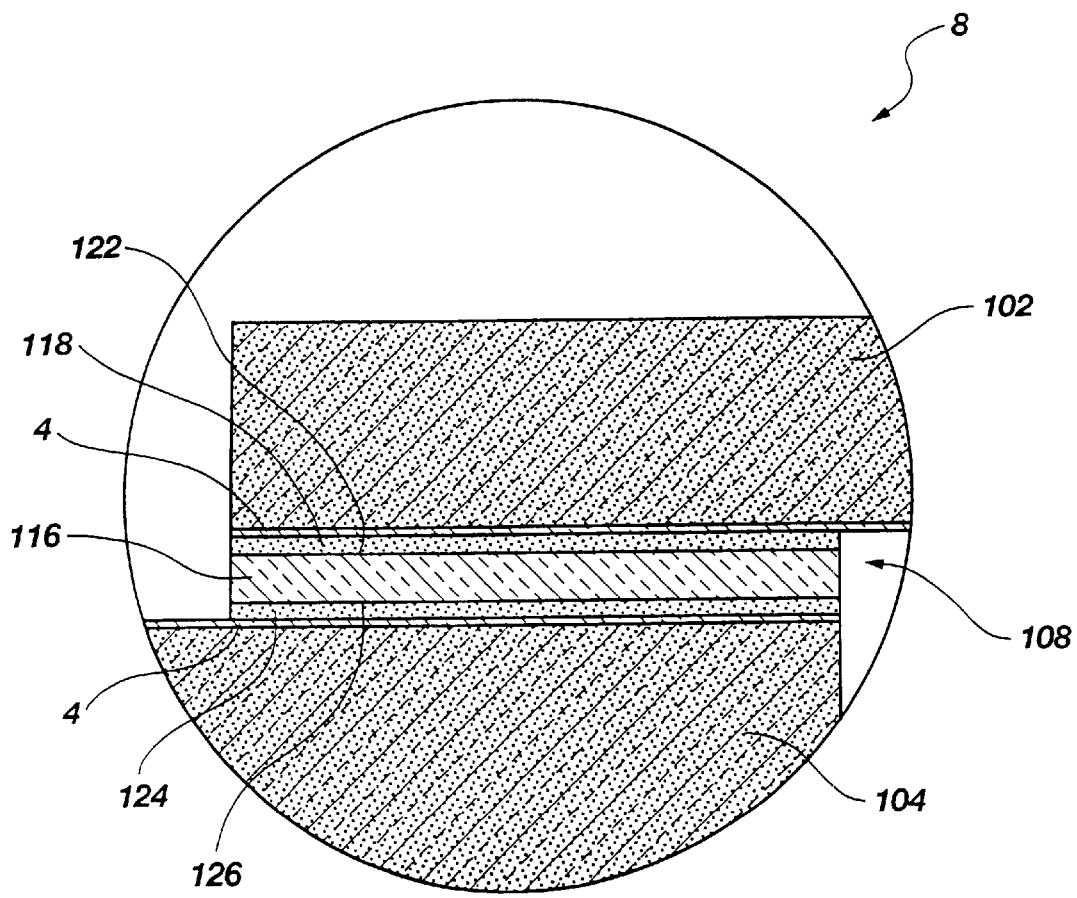
FIG. 2 is a cross-sectional side view of inset 8 in FIG. 1, illustrating a wetting agent layer with adhesive tape therebetween, according to the present invention.

In addition, according to the present invention, the adhesive tape 108 is positioned so that it abuts with the wetting agent layer 4 formed on the back surface 114 of the substrate 104 and/or the active surface 112 of the semiconductor die 102 as shown in drawing FIG. 2. It should be noted that drawing FIG. 2 illustrates the wetting agent layer 4 as being provided on both the back surface 114 of the substrate 104 and the active surface 112 of the semiconductor die 102. However, the wetting agent layer 4 may be provided only on the back surface 114 of the substrate 104 or the active surface 112 of the semiconductor die 102.

The process of adhesively attaching the semiconductor die 102 to the substrate 104 with the adhesive tape therebetween is accomplished by heating the substrate 104. This allows the first and second adhesive layers 118 and 124 on the adhesive tape 108 to flow or melt. Next, the heat is eliminated or the temperature is lowered to allow the adhesive layers to cure, thereby adhesively bonding the semiconductor die 102 to the substrate 104. According to the present invention, it has been found that by providing the wetting agent layer 4 to the surface or surfaces as previously described, the wetting agent layer 4 increases a surface tension thereon. The increased surface tension thereby enhances the adhesion between the substrate 104 and semiconductor die 102. In addition, the adhesive layers abutting the wetting agent layer 4 with an increased surface tension will flow at a lower temperature.

Thus, it can be well appreciated that by lowering the temperature necessary to adhesively bond the semiconductor die 102 to the substrate 104, the problems associated with having to heat the semiconductor assembly at a higher temperature will be prevented. Specifically, there will be a reduction of thermal stress between the semiconductor die 102 and substrate 104 and further, a reduction of outgassing from the adhesive on the adhesive tape 108 during the reflow soldering of BGA on the substrate 104 to attach the substrate 104 to another substrate.

More importantly, it can be well appreciated that by increasing the surface tension with the wetting agent layer 4 on the back surface 114 of the substrate 104 and/or the active surface 112 of the semiconductor die 102 with the adhesive tape 108 therebetween, adhesion thereto is enhanced. As a result, the present invention provides enhanced adhesion, further resulting in a more efficient and cost-effective method for adhesively bonding a semiconductor die 102 to a substrate 104.

Figure 3:
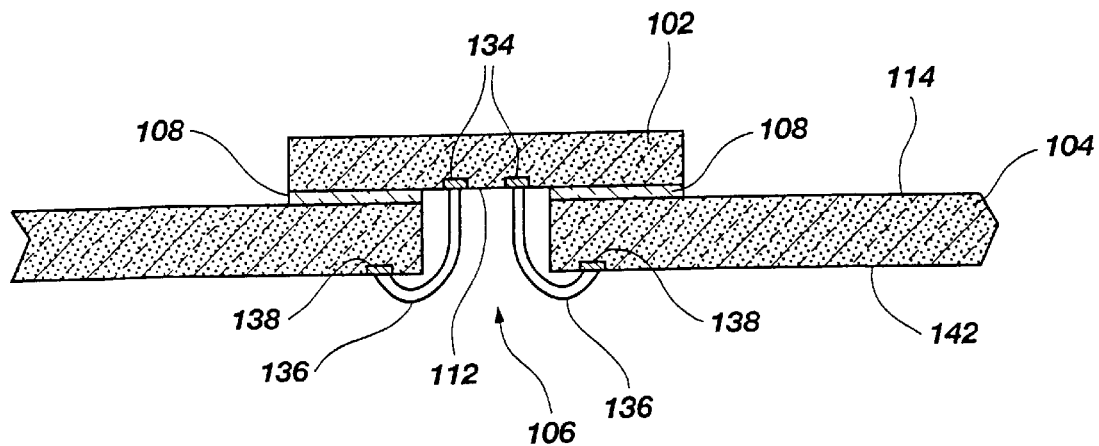
FIG. 3 is a cross-sectional side view of an intermediate semiconductor assembly, illustrating bond wire connections, according to the present invention.

In one embodiment, the semiconductor die 102 is electrically connected to the substrate 104 via the wire bonding chip-on-board technique as shown in drawing FIG. 3. As such, the active surface 112 of the semiconductor die 102 is aligned so that at least one bond pad 134 is aligned with the substrate opening 106. Electrical connections 136 in the form of bond wires are then attached between the semiconductor die bond pads 134 and traces 138 (which are in electrical communication with electrical components either internal or external to the substrate 104) on an active surface 142 of the substrate 104 through the substrate opening 106.

Figure 4:
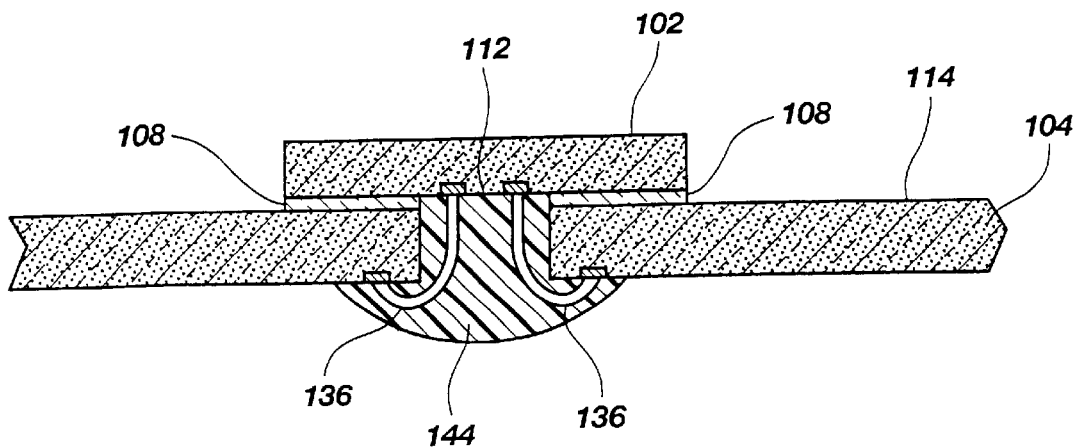
FIG. 4 is a cross-sectional side view of an intermediate semiconductor assembly, illustrating a glob top encapsulation, according to the present invention.

The substrate opening 106 is filled and the electrical connections 136 are covered with a glob top material 144 injected into the opening 106, as shown in drawing FIG. 4. Thus, the electrical connections 136 are protected from bond wire sweep and connection detachment by the glob top material 144.

Figure 5:
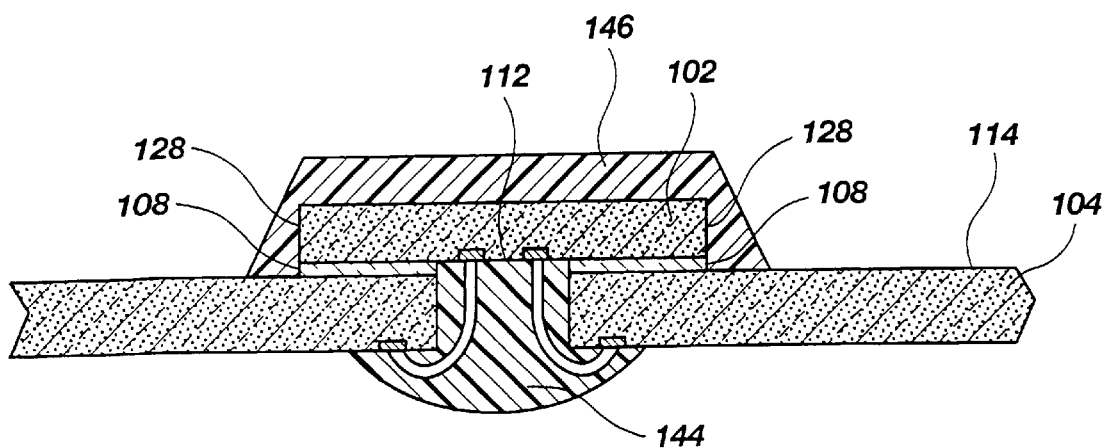
FIG. 5 is a cross-sectional side view of an intermediate semiconductor assembly, shielded by an encapsulation material, according to the present invention.

As shown in drawing FIG. 5, an encapsulant material 146 is molded over the semiconductor die 102. It is, of course, understood that the encapsulant material 146 could be a glob top material applied over the semiconductor die 102 and that the encapsulant material could also be molded to encase the glob top material 144. Again, the adhesive tape 108 extending proximate the semiconductor die edge 128 substantially prevents encapsulant material 146 from residing between semiconductor die active surface 112 and the substrate back surface 114, thereby eliminating problems associated with filler particles used in the encapsulant material 146.

Figure 6:
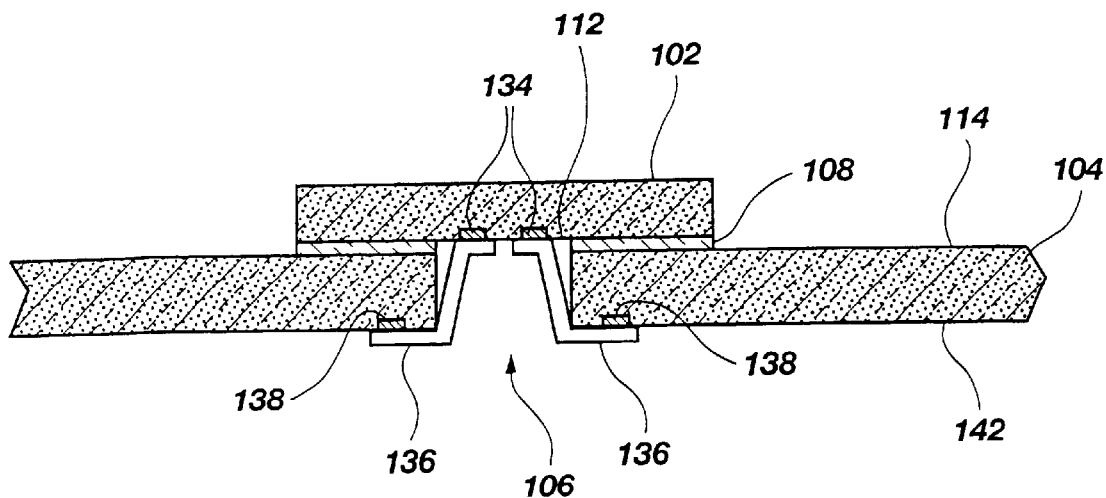
FIG. 6 is a cross-sectional side view of an intermediate semiconductor assembly, illustrating TAB connections, according to the present invention.

In a second embodiment, the semiconductor die 102 is electrically connected to the substrate 104 via the tape-automated-bonding (TAB) chip-on-board technique as shown in drawing FIG. 6. As in the previously discussed embodiment, the active surface 112 of the semiconductor die 102 is aligned so that at least one bond pad 134 is aligned with the semiconductor substrate opening 106. Electrical connections 136 (shown as TAB) are then attached between the semiconductor die bond pads 134 and traces 138 (which are in electrical communication with electrical components either internal or external to the substrate 104) on an active surface 142 of the semiconductor substrate 104 through the substrate opening 106.

Having thus described in detail preferred embodiments of the present invention, it is to be understood that the invention defined by the appended claims is not to be limited by particular details set forth in the above description, as many apparent variations thereof are possible without departing from the spirit or scope thereof. For example, the use of a wetting agent may be used to promote adhesion between any type of substrate and any type of semiconductor device, whether a bare die type device or packaged semiconductor device. Further, the use of a wetting agent may be used to promote adhesion between multiple substrates and/or multiple semiconductor devices.

What is claimed is:

1. A substrate having a front surface, a back surface, and an aperture extending through said substrate from said front surface to said back surface, said substrate for attaching a semiconductor die on a portion of said back surface using an adhesive layer, said semiconductor die having wire bonds extending therefrom through said aperture to said front surface, said substrate including:
   a wetting agent layer provided on said portion of said back surface of said substrate to promote adhesion of said adhesive layer used to attach said semiconductor die to said portion of said back surface of said substrate.

2. The substrate according to claim 1, wherein said wetting agent layer substantially covers at least a portion of said back surface of said substrate in an area surrounding said aperture through said substrate.

3. The substrate according to claim 1, wherein said wetting agent layer substantially covers said back surface of said substrate.

4. The substrate according to claim 1, wherein said wetting agent layer comprises at least one of a silane-coupling agent, a titanate-coupling agent, and a solvent base.

5. The substrate according to claim 1, wherein said wetting agent layer comprises at least one layer.

6. The substrate according to claim 1, wherein said wetting agent layer comprises a plurality of layers.

7. The substrate according to claim 1, wherein said substrate comprises at least one of a Bismaleimide Triazine substrate, an FR-4 printed circuit board, a ceramic substrate, and a polyimide substrate.

8. A semiconductor assembly comprising:
   a substrate having a front surface, a back surface, and an aperture extending through said substrate from said front surface to said back surface;
   at least one semiconductor die having an active surface having a plurality of bond pads located thereon, said at least one semiconductor die adhesively secured to a portion of said back surface of said substrate with an adhesive layer, said at least one semiconductor die having at least one bond pad of said plurality of bond pads positioned over said aperture in said substrate;
   at least one wire bond extending from said at least one bond pad of said semiconductor die through said aperture in said substrate to said front surface of said substrate; and
   a wetting agent layer provided on at least one of at least a portion of said active surface of said at least one semiconductor die and at least a portion of said back surface of said substrate to abut with at least a portion of said adhesive layer.

9. The assembly according to claim 8, wherein said wetting agent layer substantially covers at least said portion of said back surface of said substrate adjacent said aperture of said substrate.

10. The assembly according to claim 8, wherein said wetting agent layer substantially covers at least said portion of said active surface of said at least one semiconductor die.

11. The assembly according to claim 8, wherein said wetting agent layer comprises at least one of a silane-coupling agent, a titanate-coupling agent, and a solvent base.

12. The assembly according to claim 8, wherein said wetting agent layer comprises at least one layer.

13. The assembly according to claim 8, wherein said wetting agent layer comprises a plurality of layers.

14. The assembly according to claim 8, wherein said substrate comprises at least one of a Bismaleimide Triazine substrate, a printed circuit board, a ceramic substrate, and a polyimide substrate.

15. A semiconductor assembly comprising:
   a substrate having a front surface, a back surface, and an aperture extending through said substrate from said front surface to said back surface;

at least one semiconductor die having an active surface having a plurality of bond pads thereon, said at least one semiconductor die having at least one bond pad of said plurality of bond pads located over said aperture in said substrate;

a wetting agent layer provided on at least one of a portion of said active surface of said at least one semiconductor die and a portion of said back surface of said substrate; and an adhesive tape having a first side and a second side, said adhesive tape interposed between said back surface of said substrate and said active surface of said at least one semiconductor die, said adhesive tape having an adhesive coating on said first side and said second side thereof.

16. The assembly according to claim 15, wherein said wetting agent layer substantially covers at least a portion of said back surface of said substrate.

17. The assembly according to claim 15, wherein said wetting agent layer substantially covers at least a portion of said active surface of said at least one semiconductor die.

18. The assembly according to claim 15, wherein said wetting agent layer comprises at least one of a silane-coupling agent, a titanate-coupling agent, and a solvent base.

19. The assembly according to claim 15, wherein said wetting agent layer comprises at least one layer.

20. The assembly according to claim 15, wherein said wetting agent layer comprises a plurality of layers.

21. The assembly according to claim 15, wherein said substrate comprises at least one of a Bismaleimide Triazine substrate, a printed circuit board, a ceramic substrate, and a polyimide substrate.

22. The assembly according to claim 15, wherein said adhesive tape comprises at least one adhesive for adhesively attaching said substrate to said at least one semiconductor die.

23. The assembly according to claim 22, wherein said wetting agent layer abuts against said at least one adhesive of said adhesive tape interposed between said back surface of said substrate and said active surface of said at least one semiconductor die.

24. The assembly according to claim 22, wherein said wetting agent layer interacts with said at least one adhesive of said adhesive tape when said substrate heats to a predetermined temperature.

25. The assembly according to claim 15, wherein said wetting agent layer abuts against said adhesive tape interposed between said back surface of said substrate and said active surface of said at least one semiconductor die.

26. The assembly according to claim 15, wherein the semiconductor assembly comprises a chip-on-board semiconductor assembly.

27. The assembly according to claim 26, wherein said chip-on-board semiconductor assembly comprises wire bonding.

28. The assembly according to claim 26, wherein said chip-on-board semiconductor assembly comprises tape-automated-bonding.

\* \* \* \* \*